(12) United States Patent
Tan et al.

(10) Patent No.: US 10,027,295 B2
(45) Date of Patent: Jul. 17, 2018

(54) COMMON MODE GAIN TRIMMING FOR AMPLIFIER

(71) Applicant: TEXAS INSTRUMENTS INCORPORATED, Dallas, TX (US)

(72) Inventors: Wenxiao Tan, Plano, TX (US); Mayank Garg, Murphy, TX (US); Noble Narku-Tetteh, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 15/142,134

(22) Filed: Apr. 29, 2016

(65) Prior Publication Data

US 2017/0288622 A1 Oct. 5, 2017

Related U.S. Application Data

(60) Provisional application No. 62/315,328, filed on Mar. 30, 2016.

(51) Int. Cl.
| | |
|---|---|
| *H02P 1/00* | (2006.01) |
| *H03F 3/45* | (2006.01) |
| *H03F 1/56* | (2006.01) |
| *H02P 31/00* | (2006.01) |
| *G11C 7/06* | (2006.01) |

(52) U.S. Cl.
CPC ........... *H03F 3/45677* (2013.01); *G11C 7/06* (2013.01); *H02P 31/00* (2013.01); *H03F 1/56* (2013.01); *H03F 2200/481* (2013.01)

(58) Field of Classification Search
CPC ......... H01L 2924/0002; H01L 2924/00; H01L 23/552; H01L 25/072; H01L 2924/19105; H01L 2924/3011; H03F 3/45183; H03F 2203/45526; H03F 1/0277; H03F 2200/27; H03F 2200/405; H03F 2203/21127
USPC .................................................... 318/504, 34
See application file for complete search history.

(56) References Cited

U.S. PATENT DOCUMENTS

| | | | | |
|---|---|---|---|---|
| 3,652,913 A | * | 3/1972 | Leland ................. | G05D 1/0206 318/678 |
| 5,027,116 A | | 6/1991 | Armstrong et al. | |
| 5,142,238 A | * | 8/1992 | White ..................... | H03F 3/005 330/51 |
| 5,194,802 A | * | 3/1993 | Hill .......................... | G05F 1/563 323/280 |
| 6,784,698 B1 | * | 8/2004 | Brenden ............... | H03F 3/3062 327/51 |
| 6,876,266 B2 | * | 4/2005 | Koo ......................... | H03L 7/099 331/117 FE |
| 7,176,438 B2 | * | 2/2007 | Bamji ..................... | G01S 7/487 250/214 A |

(Continued)

OTHER PUBLICATIONS

PCT Search Report, International Application No. PCT/US 2017/025093, dated Aug. 17, 2017.

*Primary Examiner* — David S Luo
(74) *Attorney, Agent, or Firm* — Lawrence J. Bassuk; Charles A. Brill; Frank D. Cimino

(57) ABSTRACT

An electrical device (e.g., an integrated circuit) includes an amplifier, a configurable common mode gain trim circuit, and a memory. The configurable common mode gain trim circuit is coupled to the amplifier. The memory is configured to include trim data that is usable during an initialization process for the electrical device to configure the impedance matching circuit.

18 Claims, 3 Drawing Sheets

(56) References Cited

U.S. PATENT DOCUMENTS

| | | | | |
|---|---|---|---|---|
| 7,352,242 B1* | 4/2008 | Hughes | | H03F 1/34 330/254 |
| 7,368,987 B2* | 5/2008 | Blon | | H03F 3/45183 330/260 |
| 7,414,467 B2* | 8/2008 | Blon | | H03F 3/45941 330/260 |
| 7,507,947 B2* | 3/2009 | Bamji | | G01S 7/487 250/214 A |
| 7,733,179 B2* | 6/2010 | Forejt | | H03F 3/45183 330/253 |
| 7,880,542 B1* | 2/2011 | Gilbert | | H03F 1/0277 330/127 |
| 7,948,199 B2* | 5/2011 | Li | | H03F 1/34 318/560 |
| 8,057,239 B2* | 11/2011 | Campbell | | B60K 6/485 439/40 |
| 8,198,937 B1* | 6/2012 | Vilas Boas | | H03F 3/45475 330/258 |
| 8,208,213 B2* | 6/2012 | Liu | | G11B 20/10009 360/39 |
| 8,362,836 B2* | 1/2013 | Gilbert | | H03F 1/0277 330/254 |
| 8,384,239 B2* | 2/2013 | Campbell | | B60K 1/04 307/10.1 |
| 8,384,326 B2* | 2/2013 | Hung | | H02P 7/28 318/400.06 |
| 8,471,570 B2* | 6/2013 | Portmann | | G06F 3/0416 178/18.06 |
| 2002/0054445 A1 | 5/2002 | Chaiken | | G11B 5/012 360/67 |
| 2002/0113654 A1 | 8/2002 | Hart | | |
| 2003/0227340 A1* | 12/2003 | Koo | | H03L 7/099 331/177 R |
| 2005/0018061 A1 | 1/2005 | Choi | | |
| 2007/0075769 A1* | 4/2007 | Blon | | H03F 3/45183 330/86 |
| 2007/0115050 A1* | 5/2007 | Blon | | H03F 3/45941 330/69 |
| 2007/0285827 A1* | 12/2007 | Yamashita | | G11B 5/54 360/75 |
| 2007/0285828 A1* | 12/2007 | Yamashita | | G11B 5/54 360/75 |
| 2008/0048100 A1* | 2/2008 | Bamji | | G01S 7/487 250/214 A |
| 2008/0297253 A1* | 12/2008 | Li | | H03F 1/34 330/258 |
| 2009/0108936 A1* | 4/2009 | Forejt | | H03F 3/45183 330/258 |
| 2010/0134173 A1* | 6/2010 | Chang | | H03F 3/005 327/337 |
| 2010/0277958 A1* | 11/2010 | Campbell | | B60K 6/485 363/40 |
| 2010/0315102 A1* | 12/2010 | Portmann | | G06F 3/0416 324/680 |
| 2011/0013429 A1* | 1/2011 | Campbell | | B60K 1/04 363/40 |
| 2011/0095823 A1* | 4/2011 | Gilbert | | H03F 1/0277 330/254 |
| 2011/0109253 A1* | 5/2011 | Hung | | H02P 7/28 318/400.09 |
| 2011/0298543 A1* | 12/2011 | Liu | | G11B 20/10009 330/279 |
| 2012/0161994 A1* | 6/2012 | Quiquempoix | | H03F 3/005 341/143 |
| 2013/0307453 A1 | 11/2013 | Sugie | | |
| 2014/0176239 A1* | 6/2014 | Duggal | | H03F 3/45183 330/260 |
| 2014/0203873 A1* | 7/2014 | Kim | | H03F 3/45475 330/254 |
| 2014/0312818 A1* | 10/2014 | Furuchi | | H02P 6/14 318/400.29 |
| 2015/0084693 A1* | 3/2015 | Larson | | H03F 3/45475 330/254 |
| 2016/0072486 A1 | 3/2016 | Yang et al. | | |
| 2016/0105130 A1* | 4/2016 | Furuchi | | H02P 6/14 363/132 |

* cited by examiner

COMMON MODE GAIN TRIMMING FOR AMPLIFIER

CROSS-REFERENCE TO RELATED APPLICATIONS

The present application claims priority to U.S. Provisional Patent Application No. 62/315,328, filed Mar. 30, 2016, titled "Common Mode Gain Trimming For Current Sensing In Motor Driver-IC For Automotive Safety Application," which is hereby incorporated herein by reference in its entirety.

BACKGROUND

Amplifiers are used for a variety of purposes. For example, a sense amplifier may be used to measure current. A voltage generated across a low resistance value sense resistor is a function of the current through the resistor. The voltage across the sense amplifier is amplified by a sense amplifier and may be used in a control feedback loop. For example, the sense amplifier may be part of a motor controller device and the current through the motor is used as a feedback signal to help control the speed of the motor.

Amplifiers may have any a wide variety of architectures. Some amplifiers, for example, have an asymmetric architecture. An asymmetric amplifier is one in which the circuitry differs for signal flow of each input-to-output. For example, if the amplifier is a differential amplifier having a positive input and a negative input, the input circuitry of the positive input is configured differently than the input circuitry of the negative input. Because of such asymmetry, as well as device modelling inaccuracies, parasitic effects, and semiconductor process variations, the common mode gain of the amplifier may be higher than the value that is acceptable for various applications.

SUMMARY

In some embodiments, an electrical device (e.g., an integrated circuit) includes an amplifier, a configurable common mode gain trim circuit, and a memory. The configurable common mode gain trim circuit is coupled to the amplifier. The memory is configured to include trim data that is usable during an initialization process for the electrical device to configure the impedance matching circuit.

In other embodiments, an integrated circuit includes an asymmetric amplifier comprising first and second nodes and a configurable common mode gain trim circuit coupled to the amplifier. The configurable common mode gain trim circuit comprises a first plurality of impedance matching elements coupled between the first node and ground and a second plurality of impedance matching elements coupled between the second node and ground. The integrated circuit also may include a memory configured to include trim data that is usable during an initialization process for the electrical device to configure the first and second impedance matching elements.

In yet another embodiment, a method includes determining a common mode gain of an amplifier, comparing the determined common mode gain to a threshold, and changing the configuration of a common mode gain trim circuit of the amplifier until the common gain of the amplifier is below the threshold.

BRIEF DESCRIPTION OF THE DRAWINGS

For a detailed description of various examples, reference will now be made to the accompanying drawings in which.

DETAILED DESCRIPTION

Given the asymmetric nature of various types of amplifiers, such as amplifiers employing single-ended common-gate circuit topologies, the disclosed embodiments include a common mode gain trim circuit that is coupled to various nodes of the amplifier. The common mode gain trim circuit can be configured to adjust the impedance of the nodes in such a way that increases the common mode rejection ratio as well as the common gain. Trim data is determined for the amplifier during a trim process and the trim data is stored in memory in a device (e.g., integrated circuit) containing the amplifier. During a subsequent device initialization process, the trim data is retrieved from the memory and used to configure the common mode gain trim circuit.

The techniques described herein to reduce the common mode gain of the amplifier can be applied to any type of amplifier circuit topology. While the disclosed technique may be particularly beneficial for asymmetric amplifier topologies, the technique can be applied to symmetric amplifier topologies as well.

Figure 1:
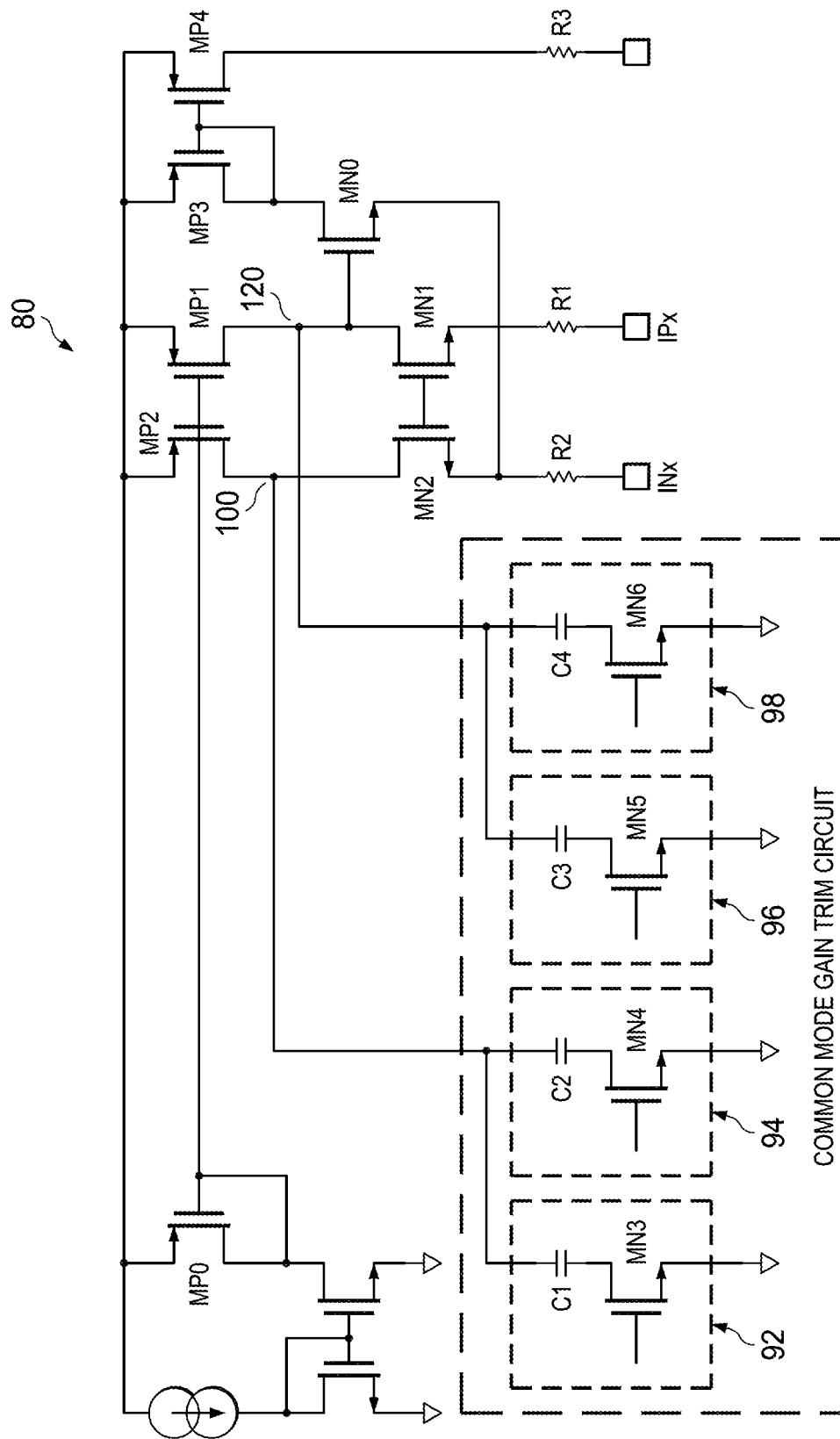
FIG. 1 shows a circuit architecture of an amplifier and includes a configurable common mode gain trim circuit to assist in reducing the common mode gain of the amplifier in accordance with various examples.

FIG. 1 shows at least a portion of an amplifier circuit 80 (or simply amplifier). The amplifier circuit in the example of FIG. 1 has an asymmetric architecture, but can be symmetric in other embodiments. The positive and negative inputs to the amplifier 80 are shown as IPx and INx, respectively. The IPx and INx inputs are connected to the sources of transistors MN1 and MN2 through resistors R1 and R2. Transistors MP1 and MP2 supply the biasing currents to MN1 and MN2 separately. The diode-connected MN2 also connects to the gate of MN1. MN1 acts as a common-gate amplifier. A negative-feedback loop is formed by MN2, MN1 and MN0 to force the MN2 source voltage to equal to the MN1 source voltage. The extra current in R2 over the biasing current coming from MN2 flows through MN0. This current contains the information of the differential voltage between IPx and INx. This current is further mirrored by MP3 and MP4 and then converted to the voltage through resistor R3.

A common mode gain trim circuit 90 also is shown in FIG. 1. The common mode gain trim circuit 90 is coupled to amplifier nodes 100 and 120 as shown. The common mode gain trim circuit 90 includes a plurality of impedance matching circuits 92-98. A first plurality of impedance matching circuits can be coupled between node 100 and ground, and a second plurality of impedance matching circuits can be coupled between node 120 and ground. In the example of FIG. 1, the first plurality of impedance matching circuits coupled between node 100 and ground includes impedance matching circuits 92 and 94, and the second plurality of impedance matching circuits coupled between node 120 and ground includes impedance matching circuits 96 and 98. Thus, each plurality of impedance matching circuits includes two impedance matching circuits in this embodiment. However, the number of impedance matching circuits in each plurality can be other than two including one or more of such circuits. Further, while the number of impedance matching circuits are the same coupled to each amplifier node 100 and 120 (i.e., 2 in this example), the number of impedance matching circuits coupled to node 100 can be different than the number of impedance matching circuits coupled to node 120. For example, in another embodiment two impedance matching circuits may be coupled to node 100, while three impedance matching circuits are coupled to node 120.

Each impedance matching circuit 92-98 may include a capacitor and a series connected switch. Impedance matching circuit 92 includes a capacitor C1 and a corresponding switch MN3. Impedance matching circuit 94 includes a capacitor C2 and a corresponding switch MN4. Impedance matching circuit 96 includes a capacitor C3 and a corresponding switch MN5. Impedance matching circuit 98 includes a capacitor C4 and a corresponding switch MN6. Thus, the common mode gain trim circuit 90 comprises multiple capacitors and corresponding multiple switches. In some embodiments, the capacitors may include lateral flux metal capacitors, but can be different types of capacitors in other embodiments. Each capacitor C1-C4 in the common mode gain trim circuit 90 is individually selectable by way of its corresponding switch MN3-MN6. The switches may be n-type metal oxide semiconductor field effect transistors (MOSFETs) in some embodiments such as that shown in FIG. 1, but can be other types of transistors such as p-type MOSFETS in other embodiments.

Each switch MN3-MN6 can be operated in an open or closed position based on a control signal provided to its gate terminal. Each switch may be controlled by a separate control signal and thus each switch is individually controlled. Because each switch has its source terminal connected to ground, closing a given switch causes the corresponding capacitor to be coupled between the amplifier node 100 or 120 and ground. Opening the switch causes the corresponding capacitor effectively to be operationally disconnected from the circuit. Thus, the control signals can be set so as to connect any combination of capacitors C1-C4 to the amplifier nodes 100, 120. For example, node 100 may have no capacitors connected to it if neither switch MN3 and MN4 are placed in the closed state by their control signals. In another configuration, switch MN3 may be closed while MN4 is opened thereby electrically connecting only capacitor C1 between node 100 and ground. In yet another configuration, switch M3 may be opened while MN4 is closed thereby electrically connecting only capacitor C2 between node 100 and ground. Finally, if both switches MN3 and MN4 are closed, then both capacitors C1 and C2 are connected in parallel between node 100 and ground. The control of switches MN5 and MN6 and their corresponding capacitors C3 and C4 is similar, thereby leaving both capacitors C3 and C4 out of the amplifier circuit 80, electrically connecting just one or the other capacitor C3, and C4 to node 120, or electrical connecting both capacitors C3 and C4 to node 120.

The control signals to be applied to the gates of the individual switches MN3-MN6 in the common mode gain trim circuit 90 may be referred to herein as "trim data." Such trim data may be determined before the amplifier circuit 80 is used. For example, the trim data may be determined at the factory before the part is shipped. A trim data determination process may be performed as described below to determine which capacitors in the common mode gain trim circuit 90 are to be electrically connected between their respective nodes 100, 120 and ground. Connecting a capacitor between a node 100 or 120 and ground adjusts the impedance of that node relative to what the impedance would have been absent the capacitor. The trim data is determined so as to more closely balance the impedance between nodes 100 and 120, which in turn advantageously reduces the common mode gain value for the amplifier circuit 80.

The capacitors that can be electrically coupled between an amplifier node 100, 120 and ground through operation of the corresponding switches may all have the same capacitance value in some embodiments which permits different integer multiples of C (e.g., C may be 30 femtofarads) to be electrically coupled between the amplifier node and ground based on a time data value that closes a number of capacitor switches corresponding to the desired integer number of capacitors. For example, if a 2C capacitor is desired, two capacitor switches are closed to electrically couple two capacitors between the amplifier node and ground. In other embodiments, the capacitors to be selectively coupled to a given node may be binary weighted (1C, 2C, 4C, etc.) which permits different integer multiples of C to be electrically coupled between the amplifier node and ground based on a binary trim data value.

Figure 2:
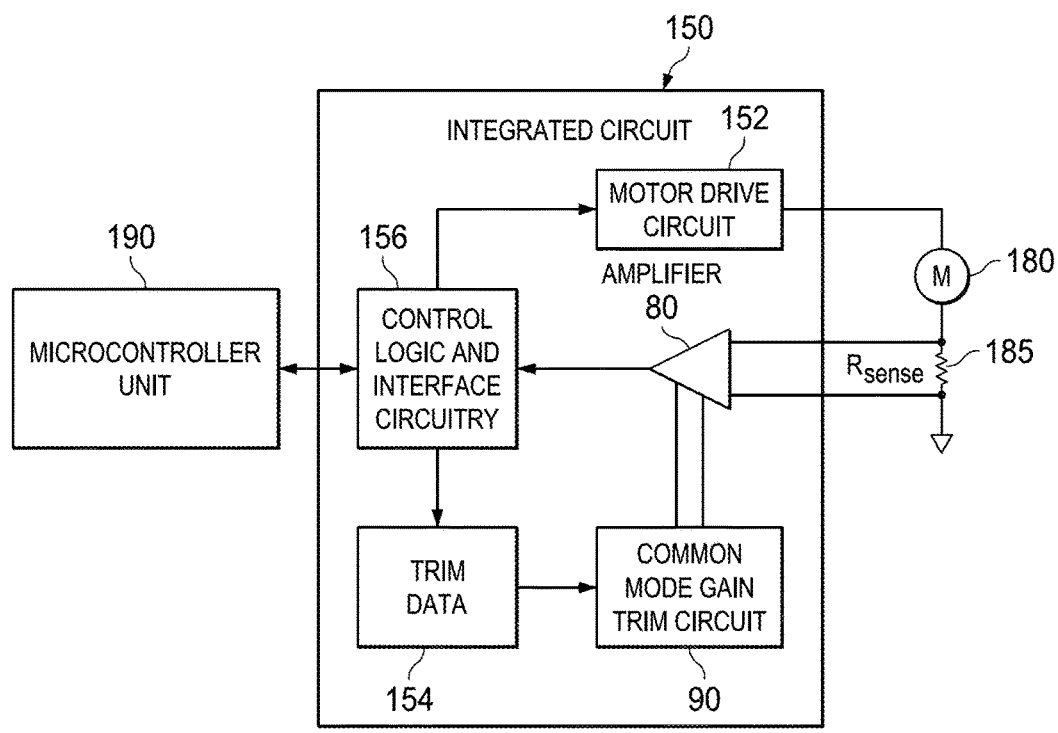
FIG. 2 depicts the integrated circuit containing the configurable common mode gain trim circuit and the amplifier coupled to a microcontroller unit in accordance with various examples.

FIG. 2 illustrates that an electrical device which may include or be an integrated circuit 150 that includes the amplifier circuit 80 and common mode gain trim circuit 90. The integrated circuit may include additional components as well such as a motor drive circuit 152, storage for trim data 154, and control logic and interface circuitry 156. The integrated circuit 150 can be coupled to a motor 180 which may be a single or multiphase motor. The motor 180 may have its own power FETs which are driven by current generated (charging or discharging current) by the motor drive circuit 152. The motor 180 connects to ground through a low resistance sense resistor 185. The sense resistor 185 is coupled to the amplifier 80 which amplifies the voltage generated across the sense resistor as a result of the current flowing through the motor 180. The amplifier provides its amplified output signal to the control logic and interface circuitry 156 (which may include conditioning circuitry such as a clamp circuit). The integrated circuit 150 may be coupled to a microcontroller unit (MCU) 190 which can be used to program and control the integrated circuit.

Figure 3:
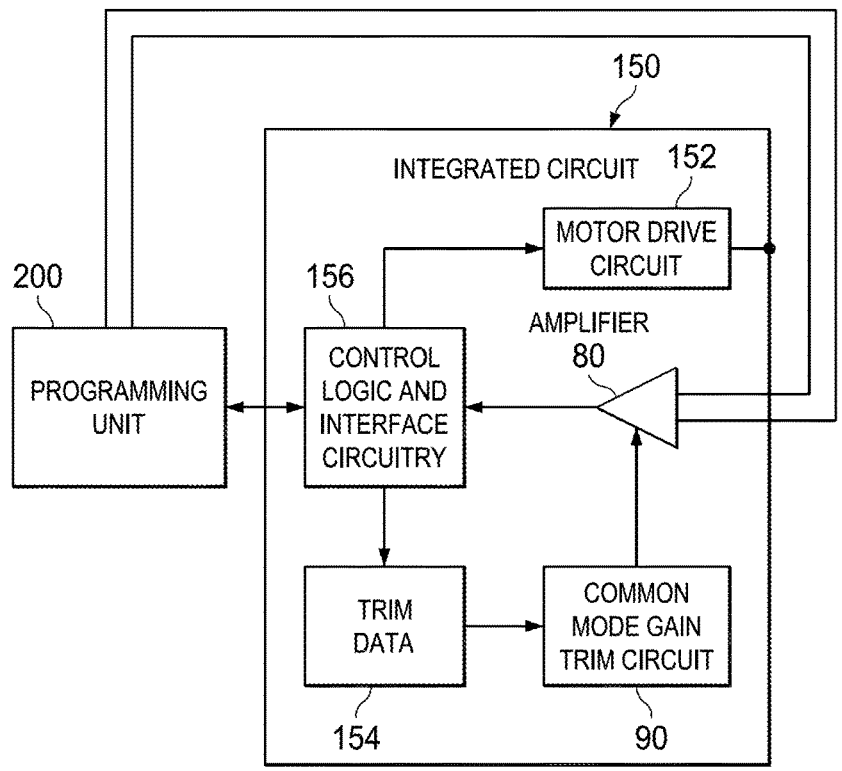
FIG. 3 shows the integrated circuit coupled to a programming unit to determine trim data for the common mode gain trim circuit so as to reduce the common mode gain of the amplifier below a maximum threshold in accordance with various examples.

FIG. 3 illustrates a configuration in which the integrated circuit 150 is coupled to an external programming unit 200. The programming unit 200 may be configured to determine trim data 154 to be programmed into the integrated circuit 150 to reduce and/or minimize the common mode gain of the amplifier 80. The programming unit may be a computer or other type of electrical equipment that has an electrical interface suitable to be connected to the integrated circuit 150. The programming unit 200 may include software or firmware executed by a processor internal to the programming unit 200. The programming unit, upon execution of its software, may be configured to determine the common mode gain of the amplifier 80 of the integrated circuit, and generate certain trim data 154 to configure the common mode gain trim circuit 90 to adjust the impedance of the amplifier's nodes 100 and 120 to reduce the common mode gain. For example, the programming unit 200 may be configured to determine trim data 154 for the common mode gain trim circuit 90 that causes the amplifier's common mode gain to be below a desired threshold. The particular threshold may be preset in the programming unit's software or may be programmable by a user of the programming unit. Some applications may necessitate a lower amplifier common mode gain value than other applications, and the programming unit may be configured to help ensure the common mode gain of the amplifier falls below the desired threshold.

The programming unit 200 may be connected to the input pins for the amplifier (i.e., the pins to which the sense resistor 185 would otherwise be connected). The programming unit is able to generate a common mode signal to be applied to both inputs of the amplifier 80. The resulting output signal from the amplifier 80 is then conditioned and provided back to the programming unit. The ratio of the magnitudes of the amplifier's output signal to the common mode input signal is computed and represents the common mode gain of the amplifier 80.

The programming unit 200 can inject a common mode signal into the amplifier's inputs, record the output signal magnitude and compute the common mode gain. If the common mode gain is too high (relative to a desired maximum level), then the programming unit can transmit updated trim data to the integrated circuit 150 for adjusting the configuration of the common mode gain trim circuit 90. The programming unit 200 then can compute the amplifier's common mode gain with the newly reconfigured common mode gain trim circuit. If the newly computed common mode gain is less than the target maximum level, then the process stops and the trim data 154 remains stored in the integrated circuit 150. Otherwise, the programming unit again transmits updated trim data to the integrated circuit in an attempt to reduce the common mode gain. The process is iterative until the programming unit computes a suitably low common mode gain for the amplifier 80.

Figure 4:
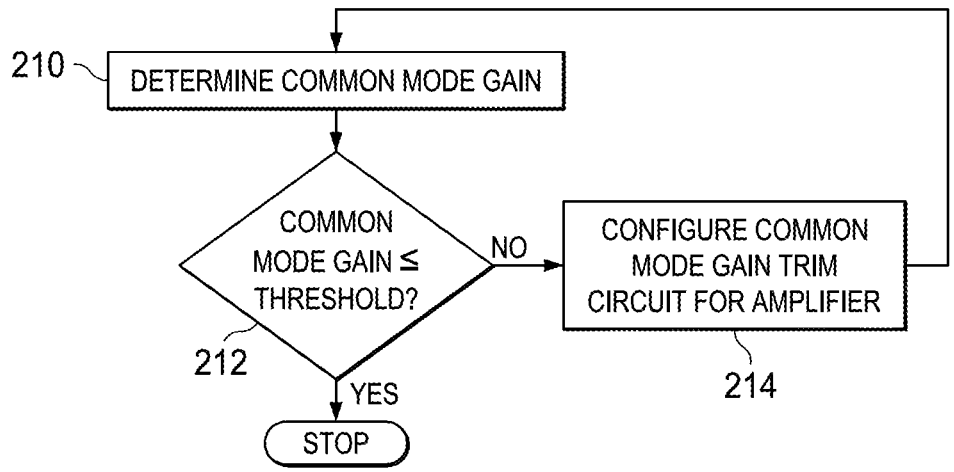
FIG. 4 illustrates a method performed by the programming unit in accordance with various examples.

FIG. 4 is a method flow chart illustrating the process for configuring the integrated circuit's trim data 154. At 210, the method includes determining the common mode gain of the amplifier. This determination can be made as explained above (e.g., injecting a common signal into the amplifier, measuring the output signal's magnitude and computing the ratio of the output signal magnitude to the input signal magnitude). The programming unit 200 can be used to perform this operation.

At 212, the programming unit 200 then compares the computed common mode gain to a threshold. The threshold may have been preprogrammed into the programming unit or may be a value indicative of the threshold received through a user interface thereby permitting a user of the programming unit to adjust the threshold to suit a particular application. If the common gain is greater than the threshold, then at 214, the method includes changing the configuration of the common mode gain trim circuit for the amplifier in an attempt to reduce the common mode gain of the amplifier. In some embodiments, this operation may include the programming unit 200 generating new trim data. The trim data can be used, for example, to select targeted capacitors within the common mode gain trim circuit 90. The newly generated trim data then may be transmitted to the integrated circuit containing the amplifier 80 and common mode gain trim circuit 90 for storage as trim data 154. Control then loops back to operation 210 at which time the common mode gain is reassessed with the newly programmed trim data. Once the programming unit 200 determines the amplifier's common mode gain to be less than the threshold (or less than or equal to the threshold), the process stops and the most trim data most recently transmitted to the integrated circuit remains loaded into the integrated circuit and used from that point forward.

Figure 5:
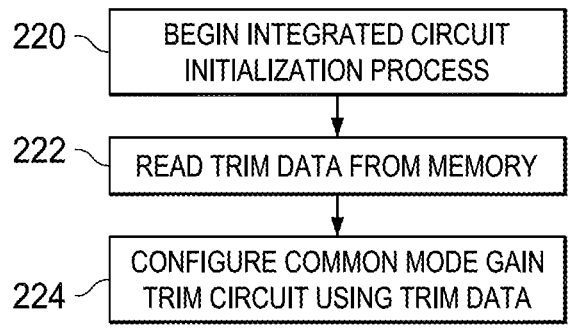
FIG. 5 illustrates a method performed by the integrated circuit to configure the common mode gain trim circuit during an initialization process.

FIG. 5 is an example of a process flow that may be performed each time the integrated circuit is initialized such as might occur during a power-on event. The initialization process for the integrated circuit begins at 220 and triggers the rest of the process flow to occur. During or after the initialization process, the trim data is retrieved from memory at 222. A state machine (e.g., a programmable controller) may be included in the integrated circuit and used to retrieve the trim data from memory. The trim data is then used (e.g., by the state machine) to configure the common mode gain trim circuit 90 at 224. The trim data may comprise a number of bits, and in some embodiments each bit is used to open or close a corresponding switch (e.g., MN3-MN6 in the example of FIG. 1) to selectively electrically couple (or not) the capacitor of each such switch between an amplifier node and ground.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electrical device, comprising:
an amplifier having a negative input, a positive input, and an output, the amplifier including a first trim node coupled to the negative input and a second trim node coupled to the positive input;
a common mode gain trim circuit having a first output coupled to the first trim node, a second output coupled to the second trim node, a ground connection, and plural trim data inputs, the common mode gain trim circuit including first impedance matching elements coupled between the first output and the ground connection, second impedance matching elements coupled between the second output and the ground connection, and each impedance matching element has a control input coupled to a trim data input; and
memory having storage for trim data and trim data outputs coupled to the trim data inputs.

2. The electrical device of claim 1, in which the trim data is usable to control a state of each of the impedance matching elements.

3. The electrical device of claim 1 in which each of the impedance matching elements includes a series combination of a capacitor and a switch, in which the switches are configured to be controlled by the trim data.

4. The electrical device of claim 3 in which the capacitors within the first and second impedance matching elements all are of a common capacitance value.

5. The electrical device of claim 3 in which the capacitors within the first impedance matching elements have binary-weighted capacitance values, and the capacitors within the second impedance matching elements have binary-weighted capacitance values.

6. The electrical device of claim 1, in which the amplifier is an asymmetric amplifier.

7. The electrical device of claim 1, in which the electrical device is an integrated circuit.

8. The electrical device of claim 1, including a motor driver circuit to drive an electric motor, and the amplifier is configured to receive a voltage input signal indicative of a current level through the motor.

9. An integrated circuit, comprising:
an asymmetric amplifier having a negative input, a positive input, an output, a first node coupled to the negative input through a first transistor, and a second node coupled to the positive input through a second transistor;
a common mode gain trim circuit having a first plurality of impedance matching elements coupled between the first node and a ground and a second plurality of impedance matching elements coupled between the second node and the ground, each impedance matching element having a control input; and
memory having storage for trim data and trim data outputs that are coupled to the trim data and the control inputs to configure the first and second impedance matching elements.

10. The integrated circuit of claim 9, in which each of the first and second pluralities of impedance matching elements includes a capacitor, and the capacitors within the first and second impedance matching elements all are of a common capacitance value.

11. The integrated circuit of claim 9, in which each of the first and second pluralities of impedance matching elements includes a capacitor, and the capacitors within the first impedance matching elements have binary-weighted capacitance values, and the capacitors within the second impedance matching elements have binary-weighted capacitance values.

12. The integrated circuit of claim 9, in which the amplifier is a sense amplifier.

13. The integrated circuit of claim 9, in which each impedance matching element of the first and second pluralities of impedance matching elements includes a capacitor in series with a configurable switch.

14. A method, comprising:
determining a common mode gain of an amplifier having a negative input, a positive input, an output, a first node coupled to the negative input, and a second node coupled to the positive input;
comparing the determined common mode gain to a threshold;
generating trim data to configure the common mode gain of the amplifier by adjusting the impedance of the first and second nodes and reducing the common mode gain to below the threshold;
storing the trim data in a memory; and
changing the configuration of a common mode gain trim circuit, having first impedance matching elements coupled to the first node and second impedance matching elements coupled to the second node, in response to the trim data stored in the memory.

15. The method of claim 14, in which changing the configuration of the common mode gain trim circuit includes generating new trim data for the common mode gain trim circuit.

16. The method of claim 15, in which changing the configuration of the common mode gain trim circuit includes transmitting the newly generated trim data to a device containing the amplifier.

17. The method of claim 16, in which determining the common mode gain, comparing the determined common mode gain to the threshold, and changing the configuration are triggered by an initialization process for a device containing the amplifier and common mode gain trim circuit.

18. The method of claim 14, including receiving a value indicative of the threshold through a user interface.

* * * * *